United States Patent
Kurjenheimo et al.

(10) Patent No.: US 6,891,505 B2
(45) Date of Patent: May 10, 2005

(54) EMC- ARRANGEMENT FOR A DEVICE EMPLOYING WIRELESS DATA TRANSFER

(75) Inventors: Timo Kurjenheimo, Oulu (FI); Kari Räisänen, Oulu (FI)

(73) Assignee: Flextronics ODM Luxembourg S.A., Zweigniederlassung Schweiz, Zug (CH)

(*) Notice: Subject to any disclaimer, the term of this patent is extended or adjusted under 35 U.S.C. 154(b) by 19 days.

(21) Appl. No.: 10/341,603

(22) Filed: Jan. 14, 2003

(65) Prior Publication Data

US 2004/0100412 A1 May 27, 2004

(30) Foreign Application Priority Data

Jan. 15, 2002 (FI) ............................................... 20020076

(51) Int. Cl.[7] ............................................... H01Q 1/24
(52) U.S. Cl. ............................... 343/702; 343/700 MS
(58) Field of Search ........................... 343/702, 700 MS

(56) References Cited

U.S. PATENT DOCUMENTS

| 5,617,106 A | 4/1997 | Tahmassebpur ............. 343/702 |
| 6,538,604 B1 * | 3/2003 | Isohatala et al. ..... 343/700 MS |

FOREIGN PATENT DOCUMENTS

| EP | 1 102 347 A2 | 11/2000 |
| JP | 11-127010 | 5/1999 |

* cited by examiner

Primary Examiner—Shih-Chao Chen
(74) Attorney, Agent, or Firm—Arent Fox

(57) ABSTRACT

The invention relates to a terminal employing wireless data transfer, comprising an enclosure structure consisting of at least one enclosure part (30), (40), (50), (60), an antenna (80) and a feed conductor (92) for receiving a signal from the antenna and/or feeding a signal into the antenna. By applying the invention, a device construction is achieved that makes it possible to improve the EMC properties of the device in a simple way and to improve the electric performance of the antenna of the device, especially to increase the frequency band of the antenna.

14 Claims, 3 Drawing Sheets

EMC- ARRANGEMENT FOR A DEVICE EMPLOYING WIRELESS DATA TRANSFER

FIELD OF THE INVENTION

The present invention relates to a shielding arrangement for a device employing wireless data transfer, such as a mobile telephone. The arrangement is designed to improve the EMC properties (EMC, Electromagnetic Compatibility) of the device as well as the electric properties of its antenna.

BACKGROUND OF THE INVENTION

The width of the frequency band available to a subscriber terminal depends on many technical solutions. The factors affecting the width of the frequency band include the antenna structure and the structure of the components connected to the antenna. The antenna needs to be able to receive and transmit signals as well as possible in all circumstances. The frequency and power of the signal transmitted via the antenna may vary considerably depending on the device, system and circumstances, so it is of essential importance for the operation of the device that the antenna should perform optimally in all situations.

In practice, all antennas need a properly functioning grounding arrangement to be able to work effectively as radiators. In the present context, the grounding arrangement for the antenna is also designated as "antenna ground", which refers generally to the grounding circuitry used to establish a low-impedance connection to the earth potential or to a common reference point.

As the physical size of the devices is diminishing, the task of implementing the desired properties is becoming increasingly difficult. In addition, terminals are required to be able to work at ever-higher frequencies and use more frequencies besides wider and wider frequency bands. The more frequencies the device can utilize and the wider is the frequency band, the more information it can transfer. The antenna structure and the components connected to it can be used as a means of determining the width of the frequency band. Depending on its type, the antenna may be connected to the antenna ground by a short-circuiting conductor (short cut). The present invention relates especially to terminals of this category.

As stated above, the antenna must be reliable and efficient in widely varying situations and environments of application. In addition to information signals, the antenna may receive various spurious signals produced by the device's own electronics. Such spurious signals have an adverse effect on the duty signal, and spurious signals may appear in the conductors connected to the antenna and be passed further via the conductors to the antenna and further into the wireless transmission. Thus, the device itself may generate such spurious signals, some of which may be produced e.g. by harmonics associated with the clock signals of the device.

The object of the invention is to improve the construction of a terminal so as to more effectively prevent spurious signals from being passed to the antenna or to conductors connected to the antenna. An additional object is to implement a device construction that allows the frequency band of the antenna of the device to be easily increased.

BRIEF DESCRIPTIONS OF THE INVENTION

The invention aims at achieving a device construction that makes it possible to improve the EMC properties of a device in a simple way. An additional objective is to improve the electric performance of the antenna of a device, especially to increase the frequency band of the antenna.

According to a first feature of the invention, a terminal employing wireless data transfer is provided, comprising an enclosure structure formed from at least one enclosure part, an antenna, and a feed conductor for receiving a signal from the antenna and/or feeding a signal into the antenna, said terminal being characterized in that it comprises a lead-in part integrated in the enclosure part and forming in the enclosure part a tubular hole through which the feed conductor is threaded to the antenna, that the said lead-in part is coated with an electrically conductive coating at least on the inner surface of the tubular hole, and that the coating is galvanically connected to the antenna ground of the device.

The short-circuiting conductor is preferably also threaded through said hole to the antenna and galvanically connected to the antenna ground at its distant end from the antenna. One side of the enclosure part is preferably provided with a coating of the same material as the inner surface of the tubular hole and the coating on the enclosure part is galvanically connected to the coating on the inner surface. The coating is preferably on the surface of a plastic enclosure structure.

The coating on the lead-in part is preferably connected to the antenna ground of the device via the coating on the enclosure part. The short-circuiting conductor and the feed conductor are preferably connected at their opposite ends from the antenna to a circuit board comprised in the device via contact surfaces formed for them. The contact surfaces are preferably in alignment with the tubular hole formed by the lead-in part.

The lead-in part is preferably not completely coated with said coating. The short-circuiting conductor and feed conductor are formed by spring contactors.

The lead-in part preferably forms a protrusion at least at the end pointing towards the antenna, so that the enclosure part extends closer to the antenna in the lead-in area than in the area around the lead-in part. The lead-in part preferably also forms a protrusion at the end opposite to the antenna, said protrusion extending outwards from the plane of the enclosure part. The terminal is preferably a portable subscriber terminal, preferably a mobile station.

According to a second feature of the invention, an enclosure part for a wireless terminal is provided, said enclosure part being characterized in that it comprises a leadin part constituting part of the same body with the enclosure part and forming a tubular hole in the enclosure part, and that the lead-in part is coated with an electrically conductive coating at least on the inner surface of the tubular hole.

On the other side of the enclosure part, the surface of the enclosure part is preferably provided with a coating identical to that on the inner surface of the tubular lead-in hole, and that the coating on the enclosure part is galvanically connected to the coating on the inner surface.

The principle of the invention is to integrate in the enclosure structure of the device a tubular lead-in hole that, on the one hand, functions as a shielding space and, on the other hand, increases the capacitance between the antenna and the antenna ground, thereby also increasing the frequency band of the antenna.

The solution of the invention is also easy and economically advantageous to implement as the tubular lead-in part can be produced without separate operations and additionally the lead-in part can be coated in the same process in which the enclosure part is coated in any case. If the connection of she feed conductor and short-circuiting conductor of the antenna is implemented using e.g. a spring contactor having good RF characteristics, then a mechanically durable connection that allows fast disconnection and causes no significant attenuation of the signal will be produced quickly and easily. Examples of this kind of spring contactors are the so-called pogo-pin type contactors.

According to a preferred embodiment of the invention, the lead-in part forms a protrusion at least at its end pointing towards the antenna, so that in the lead-in area the enclosure part extends closer to the antenna than in the area around the lead-in part. In this way, optimal shielding is achieved.

BRIEF DESCRIPTION OF THE DRAWINGS

In the following, the invention will be described in detail referring by way of example to the attached drawings, wherein.

DETAILED DESCRIPTION OF THE INVENTION

Figure 1:
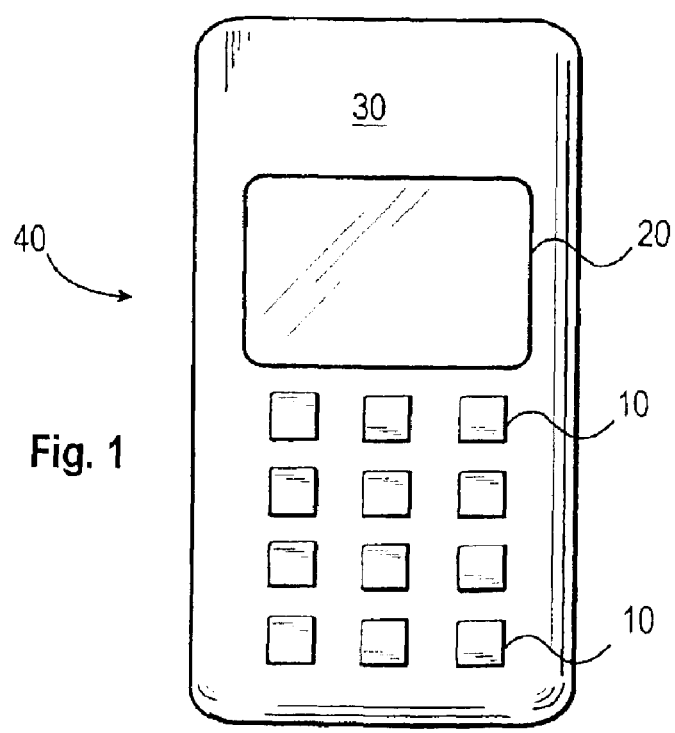
FIG. 1 presents a subscriber terminal according to the invention in front view.

FIG. 1 presents a front view of a subscriber terminal according to the invention. The terminal may be e.g. a mobile telephone 40 provided with keys 10 and display 20. The terminal may also consist of a device other than a mobile telephone because, as regards the invention, it is only essential that the device be capable of transmitting and receiving over an air interface.

The disclosed terminal comprises an enclosure or casing structure consisting of several parts, of which the figure shows the part for the side where the display and keypad of the device are placed, i.e. the so-called A-cover 30. The casing structure may also be made of e.g. plastic, glass fiber or metal or a combination of these.

Figure 2:
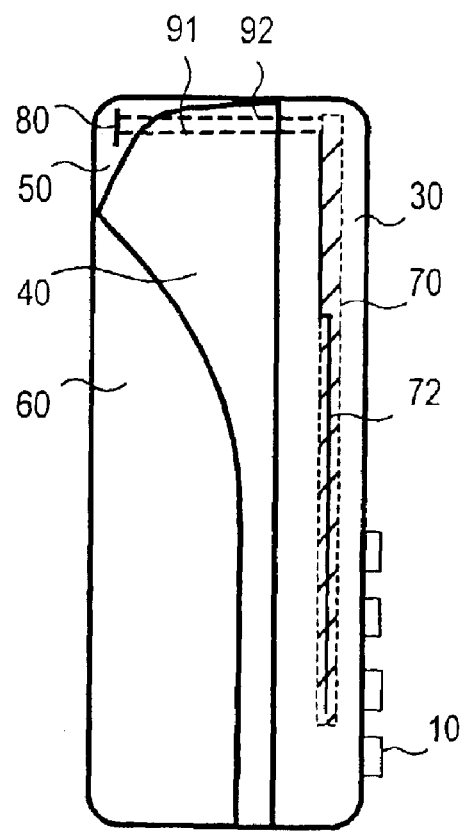
FIG. 2 presents a subscriber terminal according to the invention in side view.

FIG. 2 presents a subscriber terminal according to the invention in side view, showing the various parts of the enclosure structure of the device. In addition to the front cover 30, the terminal presented in the figure comprises a back cover, i.e. the so-called B-cover 40 and the cover 60 of a battery space. The A and B covers as well as the cover of the battery space can be detached from the device structure. The subscriber terminal presented additionally comprises an antenna 80 placed in the battery space and a battery space cover 50. In principle, the antenna, functioning as a radiator, may be either a so-called internal antenna or a so-called external antenna.

Furthermore, the terminal comprises a circuit board 70 lodged inside the enclosure structure. In practice, the circuit board is placed between the A and B covers, as can be seen from the description of FIG. 3 below. In addition, the terminal comprises electric conductors 91 and 92 connecting the respective components on the circuit board to the antenna. As shown in the figure, the conductors 91 and 92 are passed through the B-cover from the antenna space to the circuit board.

The antenna type of the antenna in the antenna space is actually of no importance, but the preferably the antenna is a so-called PIFA antenna (PIFA, Planar Inverted FAntenna). The PIFA antenna, which in the case of this example is used as an internal antenna, is made of e.g. copper. Using a PIFA antenna, it is possible to accomplish a particularly good radiation pattern and a low VSWR value (VSVR, Voltage Standing Wave Ratio). Moreover, PIFA antennas are applicable for use in a relatively wide frequency band, but as stated above, increasing the frequency bandwidth is highly desirable.

Conductor 91 is a so-called short-circuiting conductor, which short-circuits the antenna to a ground conductor 72 provided or the circuit board and functioning as antenna ground. The ground conductor thus represents a ground plane at earth potential, and besides being used as an antenna ground conductor it also serves as ground for the components on the circuit board. The length, surface area and shape of the ground conductor have an effect on the operation and properties of the antenna and the device, so the physical dimensions and shape of the ground conductor may vary considerably from case to case.

Conductor 92 is an antenna feed conductor serving to transfer a radio-frequency information signal from the device to the antenna and from the antenna to the device. Since the antenna is made of electrically conductive material, the short-circuiting conductor 91 and the antenna feed conductor 92 are galvanically connected to each other at their ends attached to the antenna. However, these conductors are not galvanically connected to each other at their ends attached to the circuit board.

The conductors are preferably implemented using a spring connector, so they can be at least partially compressed when the enclosure parts of the device are connected together. The effective length of the connection leads in the spring connector changes when they are subjected to a force acting in their longitudinal direction. Spring connectors also have good RF characteristics, so using them it is possible to form quickly and easily a mechanically durable connection that allows fast disconnection and causes no significant attenuation of the signal.

Figure 3:
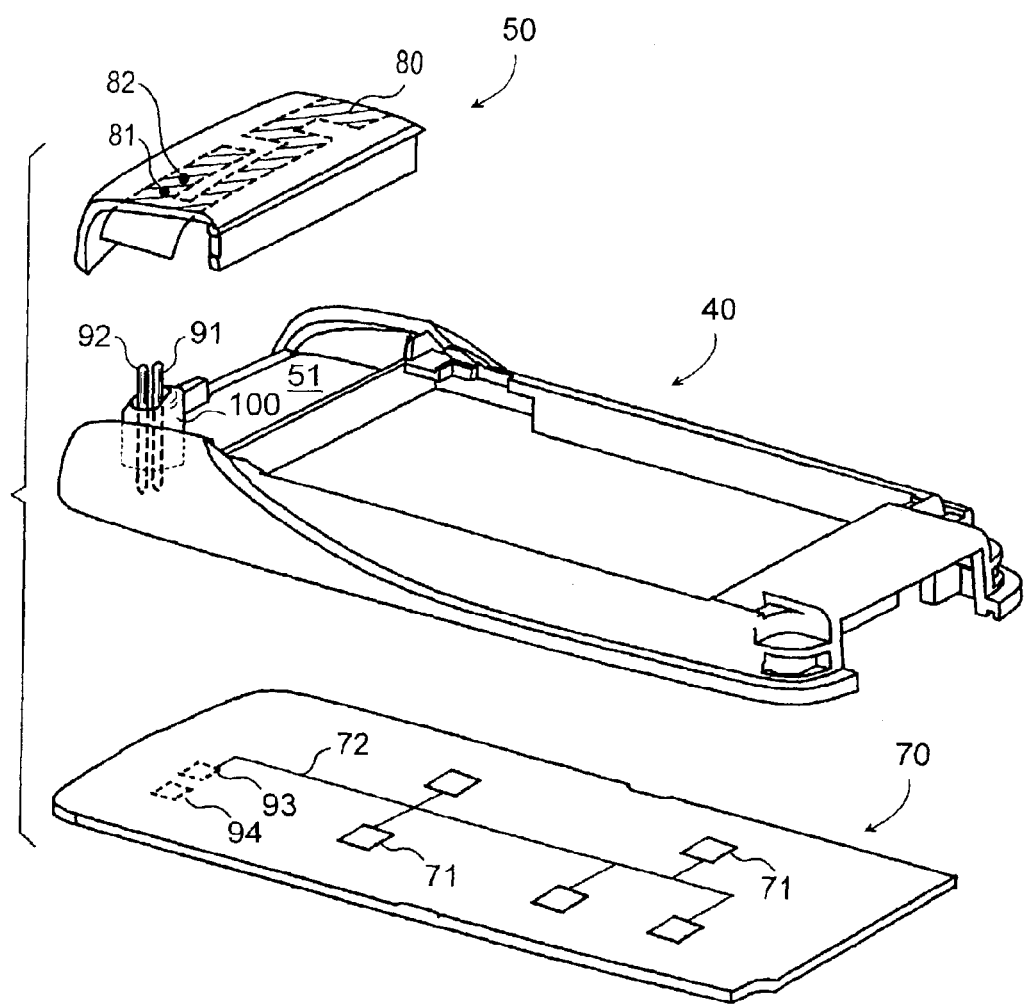
FIG. 3 is an exploded view of a structure according to the invention.

FIG. 3 is an exploded view of a structure according to the invention. The figure shows the cover 50 of the antenna space, the B-cover 40 and the circuit board 70. It can be seen from the figure that the circuit board comprises components 71, a contact surface 93 for the short-circuiting conductor 91 and a contact surface 94 for the antenna feed conductor 92. The contact surface 93 of the short-circuiting conductor 91 is connected to a ground conductor 72 provided on the circuit board and serving as ground for the components as well.

The side of the circuit board shown in FIG. 3 is the actual component side, which comprises most of the components of the circuit board. The circuit board is mounted with the actual component side facing towards the B-cover. The B-cover is provided with an electrically conductive coating on the surface facing towards the circuit board. However, this side is not necessarily coated in its entire area; instead, generally only the part that goes under the circuit board is coated. The dimensions and shape of the said side of the B-cover are adapted to the dimensions of the circuit board so that the circuit board and/or certain components on the circuit board will be placed in counterparts, such as cavities, formed in the B-cover 40. In this way, the circuit board is better positioned in the B-cover as lateral motion of the circuit board in relation to the surface of the B-cover is prevented.

In the alternative implementation presented in FIG. 3, the antenna 80 is secured to the inner surface of the cover 50 of the antenna space. The figure shows the contact points 81 and 82 on the antenna to which the short-circuiting and feed conductors are connected. When the cover of the antenna space is mounted in place on the B-cover, the end of the short-circuiting conductor 91 connected to the antenna is pressed against the antenna at point 81 and the end of the feed conductor 92 connected to the antenna similarly at point 82.

The B-cover 40 comprises a tubular lead-in part 100 formed in it for the short-circuiting and feed conductors and constituting part of the same body with the B-cover. Through the hole in the center of the lead-in part, the short-circuiting and feed conductors extend from the antenna to the contact surfaces provided for them on the circuit board. The lead-in part is coated with an electrically conductive material at least on its inner surface, but otherwise, in respect of its body material (under the coating) it forms a continuous body with the B-cover and is made of the same material.

Passing through the lead-in part, the short-circuiting and feed conductors are surrounded by electrically conductive material. The lead-in part and the coating on the enclosure part form a protective shield that obstructs or at least impedes the propagation of spurious signals into the conductors.

What was said above means in practice that, spurious signals can not produce errors in the information signal transferred in the feed conductor 92 while it is being transferred through the feed conductor. Neither can spurious signals producing e.g. ground currents appear in the short-circuiting conductor 91 or in the ground conductor.

Thus, the lead-in part functions as an EMC shield for signals going from the antenna towards the device, thereby reducing spurious signals affecting the components on the circuit board. In addition, the arrangement of the invention diminishes the propagation of spurious signals that may be produced by the components via the conductors to the antenna and further into the wireless communication.

As shown in FIG. 3, the end of the lead-in part 100 on the side of the antenna space protrudes from that surface 51 of the antenna space which is comprised in the B-cover and which lies opposite to the antenna space (cover) surface carrying the main part of the antenna 80. The aforesaid protrusion preferably reaches as close as possible to the antenna, thus providing optimal shielding of the conductors. In the area of the protrusion, the lead-in part preferably has an electrically conductive coating on both its inner and outer surfaces, whereas the rest of the surface of the lead-in part (the portion remaining inside the tube) can practically be coated on only one side, i.e. on the inner surface of the hole.

The lead-in part provided with an electrically conductive coating changes the capacitance and inductance between the ground plane and the antenna. In more accurate terms, the lead-in part increases the capacitance between the antenna and the ground plane while reducing the inductance acting on the antenna feed, allowing the feed to be better adapted to the antenna than before and the frequency band of the antenna to be increased.

Figure 4:
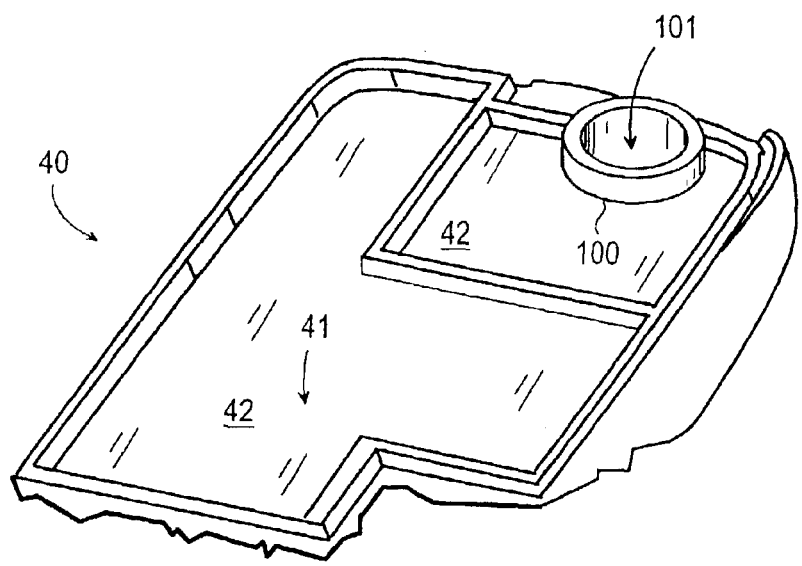
FIG. 4 presents the so-called B-cover of a terminal in front view.

FIG. 4 presents the so-called B-cover of a terminal as seen from the circuit board side. As shown in the figure, the lead-in part 10 has in its middle an opening or hole 101 for the feed conductor and the short-circuiting conductor, said hole going through the B-cover. The inner surface of the lead-in part (hole) is preferably completely coated with an electrically conductive coating material. The lead-in part 10 preferably protrudes from the planar surface 42 of the B-cover on this side of the B-cover as well. The protrusion is coated with an electrically conductive coating both on the side of the inner surface and on the side of the outer surface and also at the edge of the protrusion. Moreover, surface 42 of the B-cover is coated with an electrically conductive coating 41 designed to prevent mutual interference between the components on the circuit board. The coating on the B-cover and the coating on the lead-in part 100 practically consist of the same continuous coating material because surface 42 and the lead-in part 100 are preferably coated during the same coating process. The protrusion on the side of the coated surface of the B-cover thus has a coating both on its inner surface and on its outer surface, so this protrusion is particularly well shielded. However, the lead-in part need not necessarily comprise a portion protruding from the surface of the B-cover; instead, the edge of the opening 101 may be level with the surface 42.

The coating in the lead-in part and on the surface of the circuit board contains e.g. copper and stainless steel. The thickness of a copper coating used is typically about 1.5±0.5 $\mu$m and the thickness of a steel coating 0.2±0.1 $\mu$m. The coating material can be deposited on the surface of the cover e.g. by evaporating.

Figure 5:
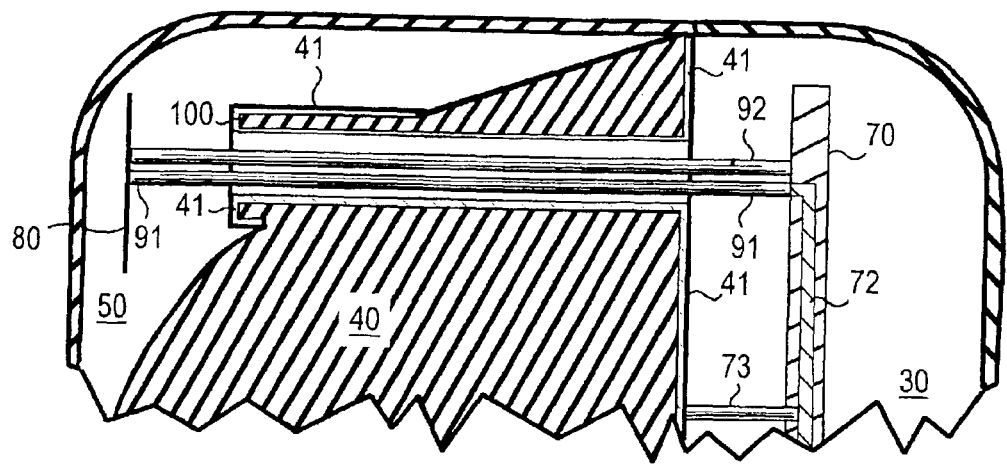
FIG. 5 presents a diagrammatic illustration of a device construction according to the invention.

FIG. 5 is a diagrammatic representation of the above-described structure when the device is ready for service. It can be seen from the figure that the circuit board comprises a ground lead 72, to which the end of the short-circuiting conductor 91, which is attached to the circuit board, is galvanically connected. The ground lead may be placed e.g. in an intermediate layer of a multi-layer circuit board. The figure also shows that the surface of the B-cover facing towards the circuit board comprises a coating layer 41, which preferably covers the entire inner surface of the lead-in hole and which additionally continues on the other side of the hole as a coating covering the lead-in part.

In addition, the device comprises a conductor 73 galvanically connecting the coating on the surface of the B-cover to the ground lead 72 on the circuit board. This conductor may be implemented in various ways, provided that a galvanic connection between the ground lead and the coating is achieved.

The ground lead 91 and especially the feed conductor 92 do not touch the coating. The coating on the surface of the B-cover and the coating of the lead-in part thus form part of the device ground and antenna ground and the coatings are at earth potential, so the lead-in part gives the conductors an optimal protection against different spurious signals.

Although the invention has been described above with reference to the examples illustrated by the attached drawings, it is obvious that the invention is not limited to them, but that a skilled person may vary the solutions described without deviating from the concept of the invention. For example, the ground lead may be placed in different ways in the device structure; it may be placed in one or more layers of the circuit board or partly or even completely in the enclosure structure. Also, a short-circuiting conductor is not absolutely necessary in all antenna structures, but the invention provides the greatest advantage in devices having an antenna provided with a short-circuiting conductor, although it is possible to achieve protection of the feed conductor and an increase of capacitance even without a short-circuiting conductor.

What is claimed is:

1. Terminal employing wireless data transfer, comprising:
   an enclosure structure formed from at least one enclosure part;

an antenna;
a feed conductor for receiving a signal from the antenna and/or feeding a signal into the antenna, characterized in that
the enclosure part comprises a leadin part integrated in it and forming in the enclosure part a tubular hole through which the feed conductor is threaded to the antenna,
the leadin part is coated with an electrically conductive coating at least on the inner surface of the tubular hole, and that
the coating is galvanically connected to an antenna ground of the device; and
a shortcircuiting conductor for connecting the antenna to the antenna ground, characterized in that the shortcircuiting conductor is likewise threaded through said hole to the antenna and galvanically connected at its opposite end from the antenna to the antenna ground.

2. Terminal according to claim 1, characterized in that the enclosure part has on one side on its surface a coating of the same material as on the inner surface of the tubular hole and that the coating on the enclosure part is galvanically connected to the coating on the inner surface.

3. Terminal according to claim 2, characterized in that the coating of the leadin part is connected to the antenna ground of the device via the coating on the enclosure part.

4. Terminal according to claim 2, characterized in that the coating is on the surface of a plastic enclosure structure.

5. Terminal according to claim 1, characterized in that the shortcircuiting conductor and the feed conductor are connected at their opposite ends from the antenna to contact surfaces formed for them on a circuit board comprised in the device.

6. Terminal according to claim 5, characterized in that the contact surfaces are in alignment with the tubular hole formed by the leadin part.

7. Terminal according to claim 2, characterized in that the leadin part is substantially entirely coated with said coating.

8. Terminal according to claim 1, characterized in that the shortcircuiting conductor and the feed conductor are implemented using spring connectors.

9. Terminal according to claim 1, characterized in that the leadin part forms a protrusion at least at its end pointing towards the antenna, so that the enclosure part extends closer to the antenna in the area of the leadin part than in the area around the leadin part.

10. Terminal according to claim 9, characterized in that the leadin part also forms a protrusion at its end opposite to the antenna, said protrusion extending outwards from the plane of the enclosure part.

11. Terminal according to claim 1, characterized in that it is a portable subscriber terminal, preferably a mobile station.

12. Terminal employing wireless data transfer, comprising:
an enclosure structure formed from at least one enclosure part;
an antenna;
a feed conductor for receiving a signal from the antenna and/or feeding a signal into the antenna, characterized in that
the enclosure part comprises a leadin part integrated in it and forming in the enclosure part a tubular hole through which the feed conductor is threaded to the antenna,
the leadin part is coated with an electrically conductive coating at least on the inner surface of the tubular hole, and that
the coating is galvanically connected to an antenna ground of the device; and
a shortcircuiting conductor for connecting the antenna to the antenna ground, characterized in that the shortcircuiting conductor is likewise threaded through said hole to the antenna and galvanically connected at its opposite end from the antenna to the antenna ground, characterized in that the shortcircuiting conductor and the feed conductor are connected at their opposite ends from the antenna to contact surfaces formed for them on a circuit board comprised in the device.

13. Terminal employing wireless data transfer, comprising:
an enclosure structure formed from at least one enclosure part;
an antenna;
a feed conductor for receiving a signal from the antenna and/or feeding a signal into the antenna, characterized in that
the enclosure part comprises a leadin part integrated in it and forming in the enclosure part a tubular hole through which the feed conductor is threaded to the antenna,
the leadin part is coated with an electrically conductive coating at least on the inner surface of the tubular hole, and that
the coating is galvanically connected to an antenna ground of the device; and
a shortcircuiting conductor for connecting the antenna to the antenna ground, characterized in that the shortcircuiting conductor is likewise threaded through said hole to the antenna and galvanically connected at its opposite end from the antenna to the antenna ground, characterized in that
the shortcircuiting conductor and the feed conductor are connected at their opposite ends from the antenna to contact surfaces formed for them on a circuit board comprised in the device, and that
the contact surfaces are in alignment with the tubular hole formed by the leadin part.

14. Terminal employing wireless data transfer, comprising:
enclosure structure formed from at least one enclosure part;
an antenna;
a feed conductor for receiving a signal from the antenna and/or feeding a signal into the antenna, characterized in that
the enclosure part comprises a leadin part integrated in it and forming in the enclosure part a tubular hole through which the feed conductor is threaded to the antenna,
the leadin part is coated with an electrically conductive coating at least on the inner surface of the tubular hole, and that
the coating is galvanically connected to an antenna ground of the device; and
a shortcircuiting conductor for connecting the antenna to the antenna ground, characterized in that the shortcircuiting conductor is likewise threaded through said hole to the antenna and galvanically connected at its opposite end from the antenna to the antenna ground, characterized in that shortcircuiting conductor and the feed conductor are implemented using spring connectors.

* * * * *